United States Patent
Van Der Wiel et al.

(10) Patent No.: US 10,031,003 B2
(45) Date of Patent: Jul. 24, 2018

(54) RELATIVE AND ABSOLUTE PRESSURE SENSOR COMBINED ON CHIP

(71) Applicants: Melexis Technologies NV, Tessenderlo (BE); X-FAB Semiconductor Foundries AG, Erfurt (DE)

(72) Inventors: Appolonius Jacobus Van Der Wiel, Duisburg (BE); Uwe Schwarz, Erfurt-Niedernissa (DE); Rudi De Winter, Heusden-Zolder (BE)

(73) Assignees: MELEXIS TECHNOLOGIES NV, Tessenderlo (BE); X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 14/956,770

(22) Filed: Dec. 2, 2015

(65) Prior Publication Data
US 2016/0153815 A1    Jun. 2, 2016

(30) Foreign Application Priority Data
Dec. 2, 2014 (GB) .................................... 1421436.5

(51) Int. Cl.
*H01L 21/00* (2006.01)
*G01F 1/34* (2006.01)
(Continued)

(52) U.S. Cl.
CPC .................. *G01F 1/34* (2013.01); *B81B 7/04* (2013.01); *B81C 1/00214* (2013.01);
(Continued)

(58) Field of Classification Search
CPC ............. B81B 2201/0264; B81B 7/04; B81C 1/00214; G01F 15/14; G01F 1/34; G01L 15/00; G01L 9/008
(Continued)

(56) References Cited

U.S. PATENT DOCUMENTS 4,975,390 A    12/1990    Fujii et al.
5,663,506 A    9/1997    Moore et al.
(Continued)

FOREIGN PATENT DOCUMENTS

CN    1974372 A    6/2007
DE    3743080 A1    7/1988

OTHER PUBLICATIONS

Extended European Search Report from corresponding European Application No. EP15197628.9, dated Jul. 1, 2016.
(Continued)

*Primary Examiner* — Duy T Nguyen
(74) *Attorney, Agent, or Firm* — Workman Nydegger

(57) ABSTRACT

A method for manufacturing a system in a wafer for measuring an absolute and a relative pressure includes etching a shallow and a deep cavity in the wafer. A top wafer is applied and the top wafer is thinned for forming a first respectively second membrane over the shallow respectively deep cavity, and for forming in the top wafer first respectively second bondpads at the first respectively second membrane resulting in a first respectively second sensor. Back grinding the wafer results in an opened deep cavity and a still closed shallow cavity. The first bondpads of the first sensor measure an absolute pressure and the second bondpads of the second sensor measure a relative pressure. The etching in the first step defines the edges of the first membrane and of the second membrane in respectively the sensors formed from the shallow and the deep cavity.

10 Claims, 8 Drawing Sheets

(51) Int. Cl.
G01L 9/00 (2006.01)
G01L 15/00 (2006.01)
B81B 7/04 (2006.01)
B81C 1/00 (2006.01)
G01F 15/14 (2006.01)

(52) U.S. Cl.
CPC .............. *G01F 15/14* (2013.01); *G01L 9/008* (2013.01); *G01L 15/00* (2013.01); *B81B 2201/0264* (2013.01)

(58) Field of Classification Search
USPC .......................................................... 438/50
See application file for complete search history.

(56) References Cited

U.S. PATENT DOCUMENTS

2005/0081621 A1* 4/2005 Zobel ...................... G01F 1/698
  73/204.26
2005/0241400 A1 11/2005 Vossenberg
2010/0058876 A1* 3/2010 Kautzsch .............. G01L 9/0052
  73/754
2010/0147082 A1 6/2010 Kurtz
2011/0309458 A1* 12/2011 Gamage ................ G01L 9/0054
  257/419
2013/0283912 A1* 10/2013 Lin ...................... G01P 15/0802
  73/514.16

OTHER PUBLICATIONS

Great Britain Search Report for corresponding Great Britain Application No. 1421436.5, dated Jun. 17, 2015.

* cited by examiner

| wafer | cavity depth [um] | Membrane thickness [um] |
|---|---|---|
| 1 | 10 | 20 |
| 2 | 10 | 20 |
| 3 | 10 | 20 |
| 4 | 10 | 15 |
| 5 | 10 | 15 |
| 6 | 10 | 15 |
| 7 | 425 | 15 |
| 8 | 425 | 15 |
| 9 | 425 | 15 |
| 10 | 425 | 20 |
| 11 | 425 | 20 |
| 12 | 425 | 20 |

RELATIVE AND ABSOLUTE PRESSURE SENSOR COMBINED ON CHIP

FIELD OF THE INVENTION

The present invention relates to the field of micro machined pressure sensors. More specifically it relates to methods and systems for measuring an absolute and relative pressure and to methods for manufacturing those systems.

BACKGROUND OF THE INVENTION

Micromechanical pressure sensors for measuring the pressure in a medium have been designed and also methods for manufacturing micromechanical sensors are described in literature. Often the substrate in which those sensors are produced is made of semiconductor material.

Differential or relative pressure sensors measure the pressure difference between two pressure environments. Typically, one of the pressure environments can be the environment's ambient pressure (as opposed to a second, pressurized environment). Absolute pressure sensors measure pressure with respect to a zero pressure reference value (vacuum reference).

A cutting-edge precision pressure-sensing technology of interest is a piezo resistive measurement technique. Piezo resistive materials have the ability to convert mechanical stress into a change of electrical properties For a pressure sensor, a semiconductor membrane is provided, and a p-type diffusion layer of piezo resistive material is formed on top of it to make a resistive layer on the membrane. The pressure on the semiconductor membrane causes the surface stress on the semiconductor material changes the resistance value. The signal changes are then amplified and interpreted as pressure readings.

Relative pressure sensors have an open back side under the membrane and the pressure sensor gives an indication of the pressure difference between the front and the back side of the membrane.

For absolute pressure sensors the back side of the membrane is vacuum sealed. The pressure in the vacuum cavity at one side of the membrane is the reference pressure which allows to make an absolute pressure measurement. Absolute pressure sensors are for example useful for measuring the pressure in a tire.

For certain applications, however, the need exists to measure an absolute and a relative pressure at the same time. Therefore, there is a need for a robust absolute pressure sensor as well as a robust relative pressure sensor present on a same die and for methods of manufacturing such systems.

SUMMARY OF THE INVENTION

It is an object of embodiments of the present invention to provide an absolute and a relative pressure sensor on a same die, producible by one and the same process.

It is an advantage of embodiments of the present invention that co-integration of an absolute and a relative pressure sensor allows obtaining an absolute and relative pressure sensor with matched performance.

It is an advantage of embodiments of the present invention that efficient manufacturing of a pressure sensor can be obtained. It is an advantage of embodiments of the present invention.

The above objective is accomplished by a method and device according to embodiments of the present invention.

The present invention relates to a method for manufacturing a pressure measurement system out of a silicon wafers for measuring an absolute and a relative pressure, the method comprising:

a first step wherein a shallow cavity and a deep cavity are etched in the base wafer, such that the depth of the shallow cavity is smaller than the depth of the deep cavity, a second step wherein a top wafer is applied to the base wafer, a third step wherein the top wafer is thinned for forming a first membrane over the shallow cavity and for forming a second membrane over the deep cavity, and wherein elements are formed in the top wafer, the elements allowing performing pressure measurements resulting in a first sensor and a second sensor, respectively, and a fourth step wherein back thinning is applied on the base wafer such that the deep cavity is opened from the backside of the base wafer and that the shallow cavity is still closed by the backside of the base wafer, such that the system can be used for measuring an absolute pressure using the first sensor and a relative pressure using the second sensor and wherein the etching in the first step defines the edge of the membranes created by the subsequent steps.

It is an advantage that this implies that both sensors have the same temperature characteristic. Therefore both sensors are matched with regard to temperature changes. Also the membrane thickness is matched for the two sensors so that the ratio of sensitivity is only defined by the ratio of membrane diameter. It is an advantage that the membrane diameter can be accurately defined in the first etching step only. It is an advantage of embodiments of the present invention that the temperature calibration of only one sensor is required. It is an advantage of embodiments of the present invention that the first cavity and the second cavity can be etched from the same side of the substrate.

The etching in the first step may be deep reactive-ion etching.

It is an advantage of embodiments of the present invention that Deep Reactive-Ion Etching (DRIE) is used. DRIE etching has steep edges, for example compared with anisotropic etching such as Potassium Hydroxide etching (KOH etching). Because of the steep edges it is possible to make smaller sensors, for example than those made using KOH. It is thus an advantage of embodiments of the present invention that the depth of the cavity can be deeper than what would be the case when using KOH as etching process. As the walls are steeper the area at the bottom part is bigger for a DRIE etching process than for a KOH etching process when the depth of both cavities is the same. It is an advantage of embodiments of the present invention that the opening at the bottom of the cavity is bigger when DRIE etching is applied than when for example KOH etching is applied. If the opening is too small, e.g. smaller than three times the depth, it is difficult to protect the cavity with gel against humidity. When humidity enters the sensor (e.g. through condensation), this humidity in the sensor might freeze thereby destroying the complete sensor. It is an advantage of embodiments of the present invention that the form of the cavity is not bound to the crystal structure as the anisotropy is not caused by the crystal structure of the silicon but by the kinetic energy of the etch gas (properties plasma). It is an advantage of embodiments of the present invention that as well round as square shapes can be chosen for the membrane shapes. It is an advantage of embodiments of the present invention that the shape of the membrane can be optimized with regard to the intended application. For example when applied as a pressure sensor, the shape can have an influence on the linearity properties of the sensor. Because of the steep sizes and because of the independence on the crystal structure very small sensors with a round membrane can be made.

The etching in the first step may comprise etching such that the horizontal cross-section of the cavities is circular. It is an advantage of embodiments of the present invention that round membranes are possible, which allows small sensor sizes. It is an advantage of embodiments of the present invention that less surface is needed for the membrane. It is an advantage of embodiments of the present invention that CMOS circuitry can be placed in the areas that otherwise would be used by the corners of a square membrane. It is an advantage of embodiments of the present invention that arrays of pressure sensors can be made.

The first step may comprise two sub-steps:
in a first sub-step the deep cavity is etched leaving at least one pillar inside the cavity, the pillar subdividing the cavity,
in a second substep the shallow cavity and a part of the at least one pillar are etched, wherein both are etched to the same depth.

It is an advantage of embodiments of the present invention that at least one pillar is present below the membrane of the relative pressure sensor. When the pressure difference across the membrane of the relative pressure sensor is so high that the membrane touches the at least one pillar, the one or more pillars will protect the membrane from breaking with higher pressures. At least the membrane will break at a higher pressure difference than when no such a pillar would be present. Similarly the bottom of the shallow cavity protects the membrane of the absolute pressure sensor. It is therefore an advantage of embodiments of the present invention that the burst pressure can be increased with regard to embodiments lacking such a pillar in the deep cavity.

The etching in the first step may comprise etching such that the area of the horizontal cross-section of the deep cavity has a different size than the area of the horizontal cross-section of the shallow cavity.

It is an advantage of embodiments of the present invention that the size of the membrane can be different between the absolute and relative pressure sensor. This allows to optimize for different pressure ranges on one chip. The piezo resistors and membrane thickness will be the same (matched) of the two sensors as they are processed next to each other on the base wafer. Therefore the ratio of sensitivity is given by the square of the ratio of the membrane diameters.

The formation of the elements allowing performing pressure measurements may be performed on the stack of the base substrate and the top substrate, after they have been applied to each other.

The formation of the elements may be performed by CMOS like processing.

Applying the base substrate on the top substrate may comprise bonding said base substrate and said top substrate in a vacuum environment.

The second step of applying a top wafer to the base wafer may comprise joining the top wafer to the base wafer using fusion bonding. The fusion bonding may be performed at a temperature above 900° C., e.g. at a temperature above 1000° C., for obtaining a high quality bonding. It is an advantage of embodiments of the present invention that no interconnect needs to be positioned between the membrane and the base wafer comprising the pressure ports.

It is an advantage of embodiments of the present invention that a robust and stress free joint between the wafers can be obtained. It is an advantage that no interconnect needs to be provided between the membrane and the base wafer comprising the pressure cavities.

The present invention also relates to a pressure measurement system for measuring both an absolute and a relative pressure, the system comprising:
a base wafer comprising a closed shallow cavity with a first membrane over the shallow cavity forming an absolute pressure sensor, and
on the same base wafer, an open deep cavity, with and a second membrane over the deep cavity forming a relative second pressure sensor,
wherein the edge of the first membrane respectively second membrane is determined by the shallow cavity respectively the open deep cavity of the base wafer.

The edges of the shallow cavity and of the deep cavity may have an angle of between 80° and 100° with the vertical axis.

The horizontal cross-section of the shallow and deep cavities may be circular.

The shallow cavity may have a bottom and the deep cavity may comprise at least one pillar,
wherein the top of the pillar may have the same height as the bottom of the shallow cavity.

The area of the horizontal cross-section of the deep cavity may have a different size than the area of the horizontal cross-section of the shallow cavity.

The relative and absolute pressure sensors may comprise bondpads, wherein the bondpads can be made of platinum, aluminum or gold The joint between the membrane and the base wafer of the pressure cavities may be a joint obtained by fusing bonding, e.g. a joint obtained by fusion bonding above 900° C., e.g. above 1000° C. The membrane and the base wafer of the pressure cavities may be directly positioned to each other, without the need for an interconnecting means.

It is an advantage of embodiments of the present invention that the sensors can be used in reactive environments (e.g. for inlet and exhaust applications).

The present invention also relates to a flow meter for measuring a gas flow, the flow meter comprising a housing for housing a pressure measurement system as described above,
wherein the housing comprises a tube having a first opening and a second opening a cavity in communication with the first opening and the second opening, wherein the system is positionable such that the cavity is separated in a first part in communication with the first opening and a second part in communication with the second opening,
one side of the second membrane of the relative pressure sensor of the system is in the first part of the cavity, the other side of the second membrane of the relative pressure sensor being in the second part of the cavity.

The first membrane of the absolute pressure sensor may be in the first part of the cavity.

It is an advantage of embodiments of the present invention that both the absolute pressure sensor as well as the relative pressure sensor are present on the same die. It is an advantage of embodiments of the present invention that with one device both the absolute as well as the relative pressure can be measured. As a consequence it is an advantage of embodiments of the present invention that with one device a flow meter can be realised.

Particular and preferred aspects of the present invention are set out in the accompanying independent and dependent claims. Features from the dependent claims may be combined with features of the independent claims and with features of other dependent claims as appropriate and not merely as explicitly set out in the claims.

The above and other aspects of the present invention will be apparent from and elucidated with reference to the embodiment(s) described hereinafter.

Figure 1:
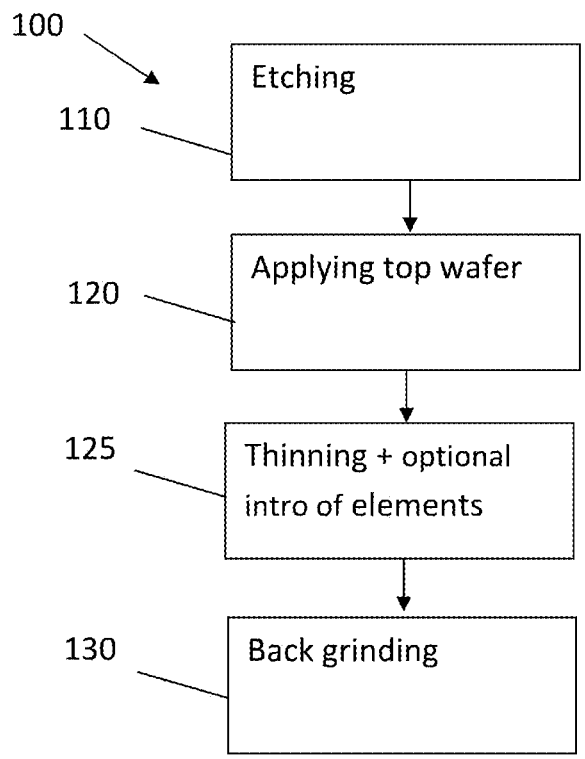
FIG. 1 shows a flow chart illustrating steps in an exemplary method for making a system on a single die for measuring both an absolute and a relative pressure according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to orientation indications such as vertical and horizontal it is assumed that the wafer is in a horizontal plane. This means for example that the cavities are etched in the vertical direction in the horizontal wafer.

In a first aspect the present invention relates to a method 100 for manufacturing a pressure sensing system 200 in a base wafer 210 for measuring an absolute and a relative pressure. An embodiment of such a method is schematically illustrated in FIG. 1.

The method 100 comprises a first step 110 wherein a shallow cavity 220 and a deep cavity 230 are etched in the base wafer 210, such that the depth of the shallow cavity 220 is smaller than the depth of the deep cavity 230. The etching in the first step also will determine the edges of the membranes that will be used in the pressure sensors. In embodiments of the present invention a second step 120 comprises applying a top wafer 510 on top of the base wafer 210 into which the shallow and deep cavities 220, 230 have been etched. In embodiments of the present invention, the top wafer and base wafer can be joined by fusion bonding. This can occur at high temperature, such as above 900° C. or above 1000° C., such that the bonding is robust and stress free.

In a third step 125, the top wafer 510 is thinned, to the thickness of a membrane, for forming a first membrane 262 over the shallow cavity 220 and for forming a second membrane 272 over the deep cavity 230.

Moreover, in the top wafer 510 elements, such as first bondpads 261 for Piëzo-resistivity measurements over the first membrane 262, and second bondpads 271 for Piëzo-resistivity measurements over the second membrane 272 typically are formed. It is to be noticed that a part of the electrical connections required can be common. Thereby, the basis for a first pressure sensor 260 and a second pressure sensor 270 is realised.

In embodiments of the present invention the fourth step 130 comprises back thinning, for instance back grinding of the base wafer 210 such that the deep cavity 230 is opened from the backside of the base wafer 210 and such that the shallow cavity 220 is still closed by the backside of the base wafer 210.

Figures 15, 16:
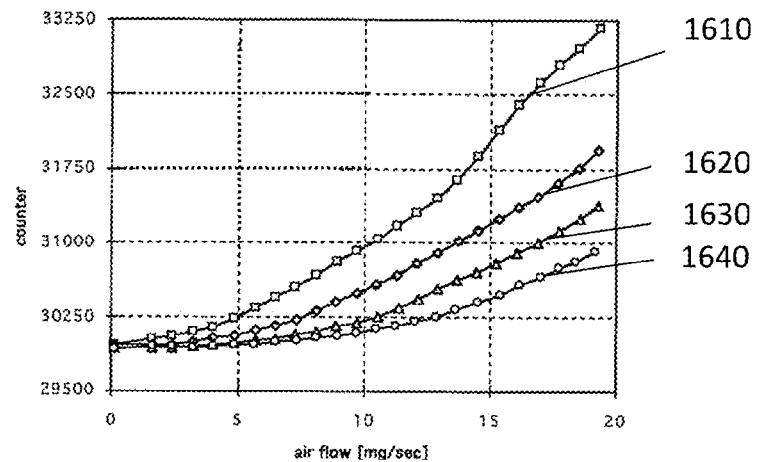
FIG. 15 shows a chart illustrating the relationship between the air flow and the relative pressure measurement and the dependency on the absolute pressure of this relationship.
FIG. 16 shows an overview of a set of wafers with different cavity depths and membrane thicknesses in accordance with embodiments of the present invention.

In embodiments of the present invention the result of the method 100 is a pressure sensing system 200 according to embodiments of the present invention, comprising a first membrane 262 over the shallow cavity 220 with a vacuum reference pressure at the back of the first membrane 262, inside the shallow cavity 220, and, on the same die, a second membrane 272 over the deep cavity 230 with a connection to the outside world. The cavities in the base wafer thereby define the edges of the membranes used in the pressure sensors. The pressure range of the cavity of the absolute pressure sensor is between 0 and 0.25 bar and is defined during the bonding. The bonding process allows in principle internal pressures from 0 to 1 bar up to 400° C. Vacuum is preferred as it will push the wafers together. In embodiments of the present invention the first membrane 262 and/or the second membrane 272 have a thickness between 5 μm and 100 μm for example about 15 or 20 μm. An overview of a set of exemplary wafers with different cavity depths and membrane thicknesses is shown in FIG. 16.

Uniformity of the membrane thickness over the entire wafer is important to minimise the sensitivity variation on a wafer. For that reason it may be of interest to use a SOI wafer for the top wafer and use the buried oxide as etch stop for the removal of the bulk silicon. Using the buried oxide as etch stop also has the advantage that the thickness variation of the bulk wafer does not influence the membrane thickness variation. Without using such an etch stop layer thinner parts of the bulk wafer will result in relatively thicker membranes.

In embodiments of the present invention the result of the method 100 is a pressure sensing system 200 according to embodiments of the present invention that can be used for measuring an absolute pressure using the first bondpads 261 of the first sensor 260 and a relative pressure using the second bondpads 271 of the second sensor 270. In embodiments of the present invention the etching applied during the cavity etching step 110 may be anisotropic wet etching. For example potassium hydroxide (KOH) etching, might be applied. KOH etching has an etch rate which is dependent on the crystal directions. Practically no etching occurs perpendicular to the <111> planes. Such anisotropic etching has as a consequence that the shallow cavity 220 or deep cavity 230 always has a rectangular horizontal cross section with the largest diameter at the surface with the etch mask. Because of the anisotropic etching it is not possible to create circular membranes. Moreover, because of the anisotropic etching the area of the horizontal cross section of the cavity becomes smaller when going deeper into the wafer.

Figure 3:
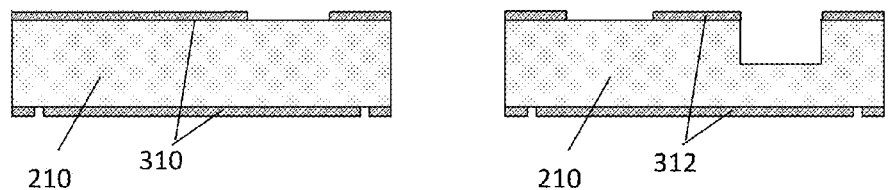
FIG. 3 illustrates a wafer and a mask for etching according to embodiments of the present invention.
Figure 4:
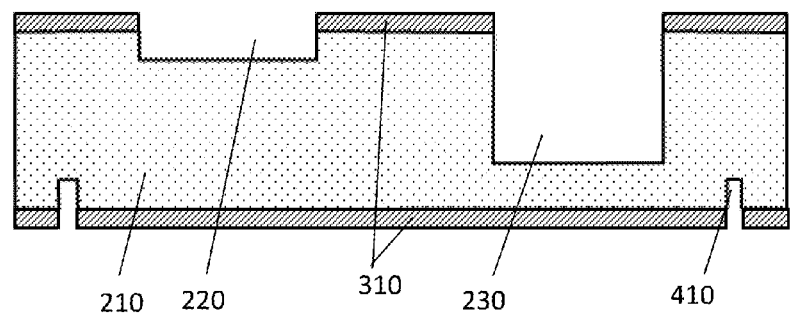
FIG. 4 illustrates a shallow and a deep cavity after etching according to embodiments of the present invention.

In alternative embodiments of the present invention anisotropic plasma etching can be applied such as for example deep reactive ion etching (DRIE). Using DRIE it is possible to realise shallow cavities 220 and deep cavities 230 with vertical walls. An example of this process is shown in FIG. 3, showing the base wafer 210 and a first mask 310 on the left and the wafer and a second mask on the right. One starts with etching the wafer in the right window by covering the left window with a mask. After the deep etch the left window is opened and the shallow etch is performed, thus using the mask 312 as shown on the right hand side. FIG. 4 shows the shallow cavity 220 and the deep cavity 230 after applying DRIE. In embodiments of the present invention the first mask 310 on the backside of the wafer comprises optional openings (illustrated in FIG. 3), which after etching will result in etched holes 410 (shown in FIG. 4) that may serve as an alignment basis.

In these embodiments, both the shallow cavity 220 as well as the deep cavity 230 have substantially vertical edges. Therefore, the area of the cross-section of the cavity remains the same at any depth within the wafer 210. Therefore also, the bottom opening of the deep cavity 230 after back grinding is bigger with DRIE than for example when anisotropic etching such as for instance KOH etching is applied.

Figure 2:
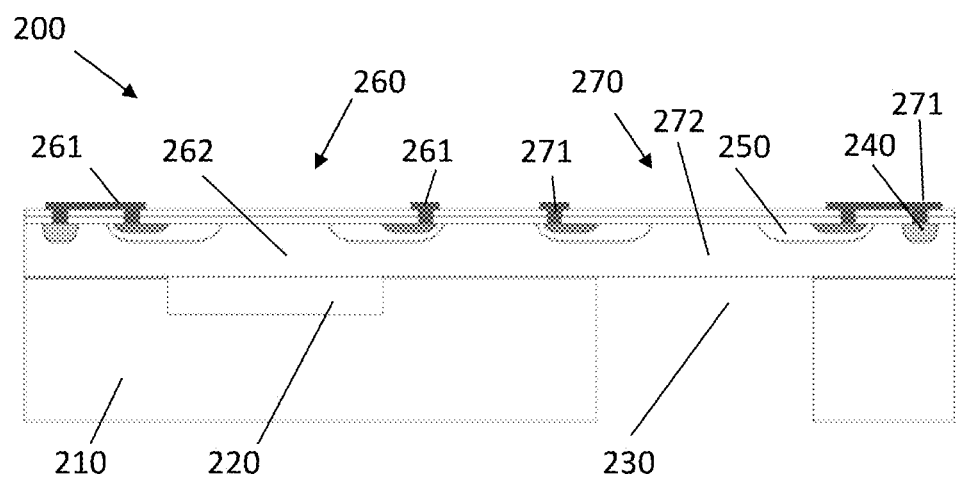
FIG. 2 shows a schematic vertical cross-section of a system according to embodiments of the present invention, comprising both an absolute and a relative pressure sensor on a single die.

In some embodiments, RIE etching also allows to make the bottom of the cavity created even wider than the top. FIG. 2 illustrates an exemplary embodiment of the present invention. The opening after back grinding is also shown in FIG. 2. In embodiments of the present invention where for example KOH etching is applied the opening that is created by back grinding is much smaller than the membrane surface. Such an anisotropically etched opening is not suitable for applications where water condensation at the back of the membrane can take place. Such a shape may cause membrane cracks when for instance water freezes near the membrane, as the shape of the cavity does not allow the ice to move away from the membrane. An important feature of the steep sidewalls obtained by DRIE etching is that when water condensates and freezes at the membrane 272 it is not trapped in a tapered structure (like for example with anisotropic etching) that might cause the membrane to break when the water expands due to freezing. Therefore it is an advantage of embodiments of the present invention that vertical walls can be created (e.g. by DRIE) which result in an opening at the back of the obtained system 200 that is similar to the membrane dimensions. This cannot be achieved with KOH etching on standard wafers with a surface in the <100> direction. Nevertheless, wafers with a <110> orientation can be used, with a limited aspect ratio.

In embodiments of the present invention both the absolute as well as the relative pressure sensor are created using a single fabrication process, comprising a first step 110 of cavity etching, a second step 120 of applying the top wafer, a third step 125 of thinning the top wafer and processing the electronic circuit with the piezo resistors and a fourth step 130 of applying back grinding for opening the deep cavity thereby realizing a relative pressure sensor. In some embodiments, the cavities can be formed such that they are not tapered. In embodiments of the present invention the properties of the absolute and relative sensors are matched. In embodiments of the present invention the membrane size of the absolute pressure sensor 260 might be different from the membrane size of the relative pressure sensor 270. It is an advantage of embodiments of the present invention that the sensitivity for each sensor 260, 270 can be optimized with regard to the application by designing another membrane size. The sensors 260, 270 can for example be optimized for different pressure ranges on one chip. The size of the membranes, determined by the membrane outer edges, is determined by the pressure cavities in the base wafer.

Figure 13:
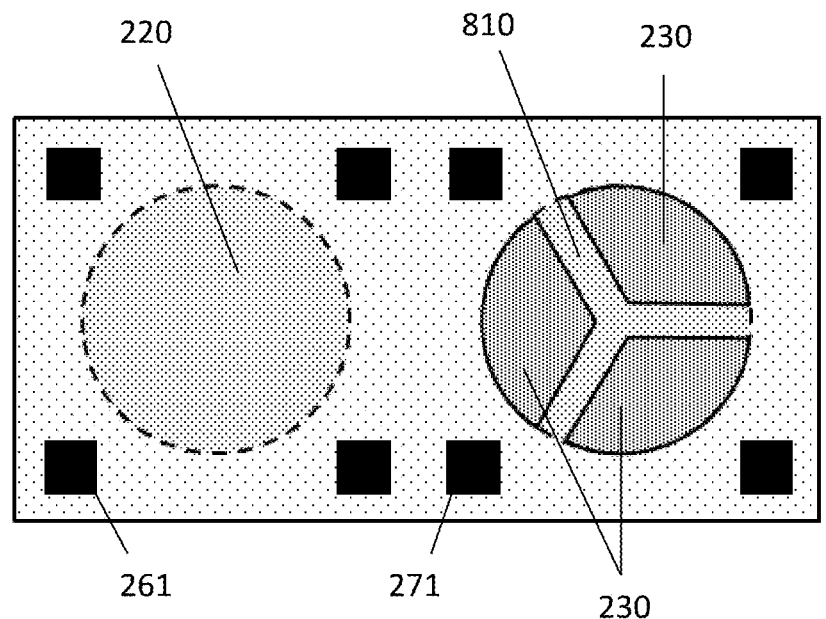
FIG. 13 is a top view of a particular embodiment of a shallow cavity and a deep cavity for an absolute and a relative pressure sensor according to embodiments of the present invention.
Figure 18:
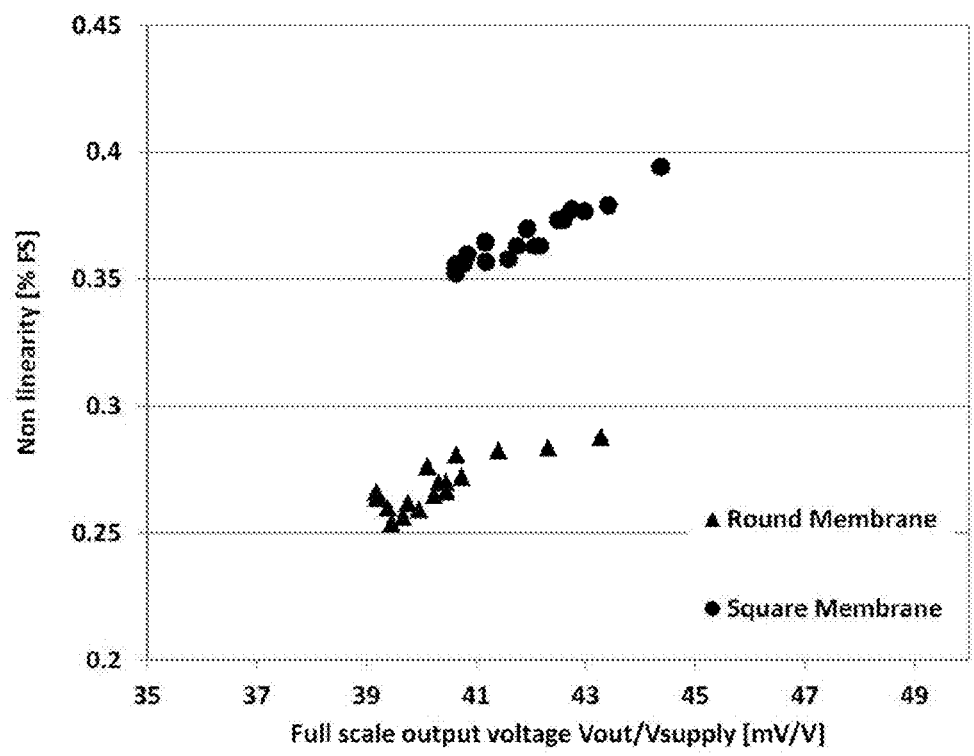
FIG. 18 illustrates the linearity of sensors having a square shaped membrane and sensors having a round membrane, with matched sensitivity.

In embodiments of the present invention the etching step 110 comprises etching such that the horizontal cross-section of the cavities is circular. In embodiments of the present invention both round as well as square membranes can be defined. Hereby the membranes may have the same form as the horizontal cross-section of the cavity. In embodiments of the present invention DRIE is used to create cavities with steep sidewalls independent of the crystal lattice. FIG. 18 shows the linearity of matched sensors with a round membrane and with a rectangular membrane. It can be seen that the linearity for sensors with a round membrane is substantially better than the linearity of the sensors with a rectangular membrane. The sensors used are matched, meaning that they make use of the same resistors and the same membrane thickness. The membrane diameters are different to assure that both sensors give the same output when the same pressure signal is applied. A second consequence is that one can make very small sensors with a round membrane and the bondpads in the corners of a die. FIG. 13 shows a top view of a system 200 according to an embodiment of the present invention, with two circular-shaped sensors. It shows a shallow cavity 220 with a round horizontal cross-section. Applying DRIE in combination with back grinding allows creating cavities with round openings and with vertical walls thus avoiding membrane breakage due to frozen condensated water, as explained above.

Figure 7:
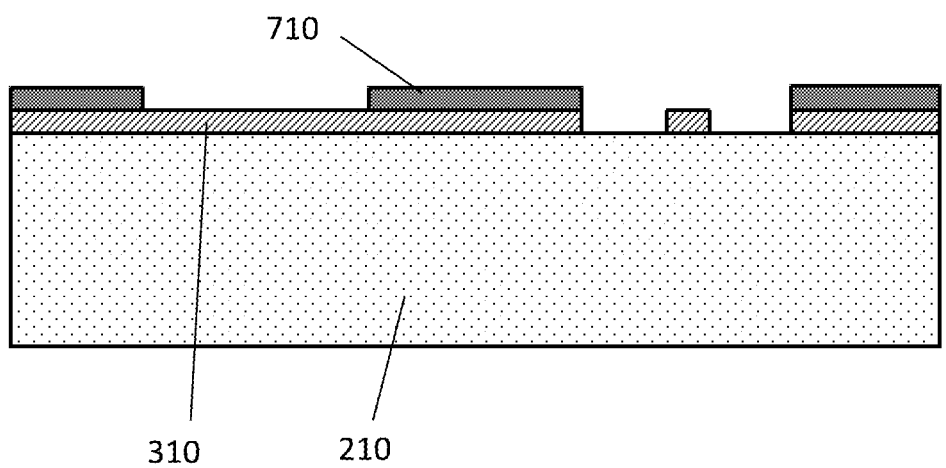
FIG. 7 illustrates a wafer and two masks for etching according to alternative embodiments of the present invention.
Figure 8:
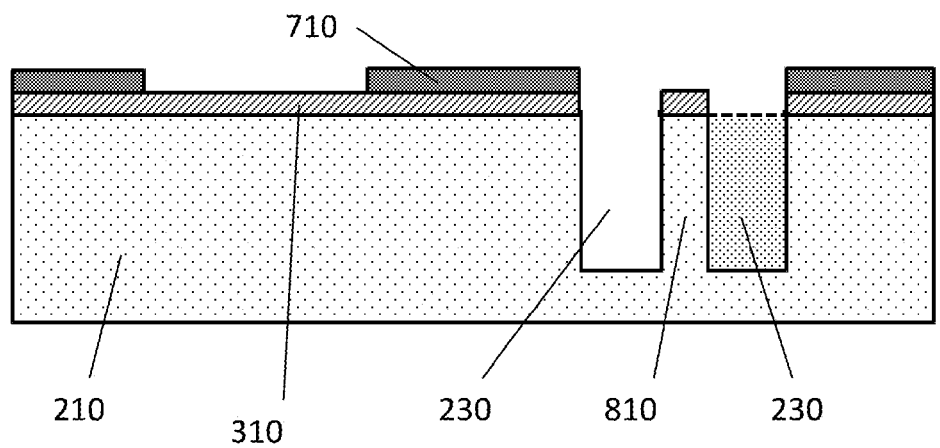
FIG. 8 illustrates a deep cavity with pillar after etching according to embodiments of the present invention.
Figure 9:
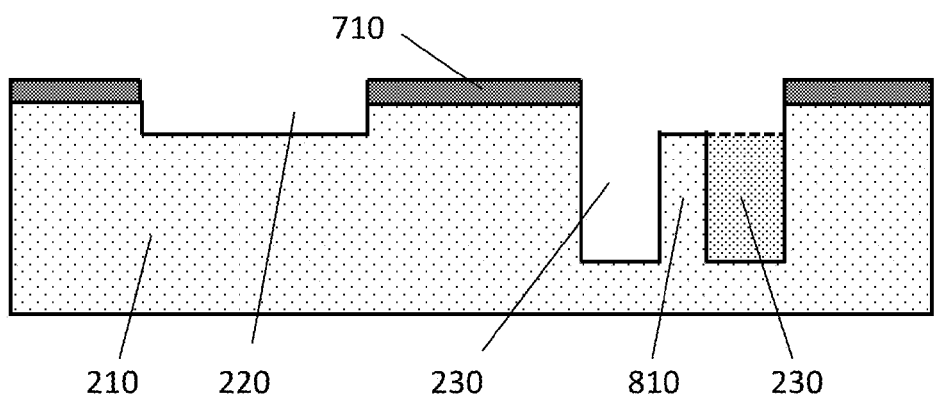
FIG. 9 illustrates a shallow cavity and a deep cavity with pillar after etching according to embodiments of the present invention.

In embodiments of the present invention the etching step 110 may comprise two sub-steps, as illustrated in FIG. 7 to FIG. 9. In a first sub-step—see FIG. 8—the deep cavity 230 is etched wherein not all of the wafer material within the cavity 230 to be formed is etched away such that at least one pillar 810 remains, the pillar 810 subdividing the cavity 230. Alternatively worded: a plurality of cavities 230 may be formed close to one another, leaving a structure of pillars 810, possibly forming a kind of walls, in between them. In a second sub-step—see FIG. 9—the shallow cavity 220 and a top part of the pillar(s) 810 are etched, wherein both are etched to the same depth. FIG. 13 shows an exemplary embodiment of the present invention realized using method steps according to the present invention. It shows a deep cavity 230 subdivided by three pillars 810. The presence of the pillars 810 may limit the membrane deflection when submitted to a high pressure, thus protecting the membrane 272 from bursting. In embodiments of the present invention the number of pillars 810 can vary or any other structure supporting the membrane when the deflection exceeds a certain threshold is possible. It is an advantage of embodiments of the present invention that the burst pressure can be increased with regard to a pressure sensor lacking the supporting pillar(s) 810. In FIG. 13 also the first bondpads 261 and second bondpads 271 are shown.

Figure 10:
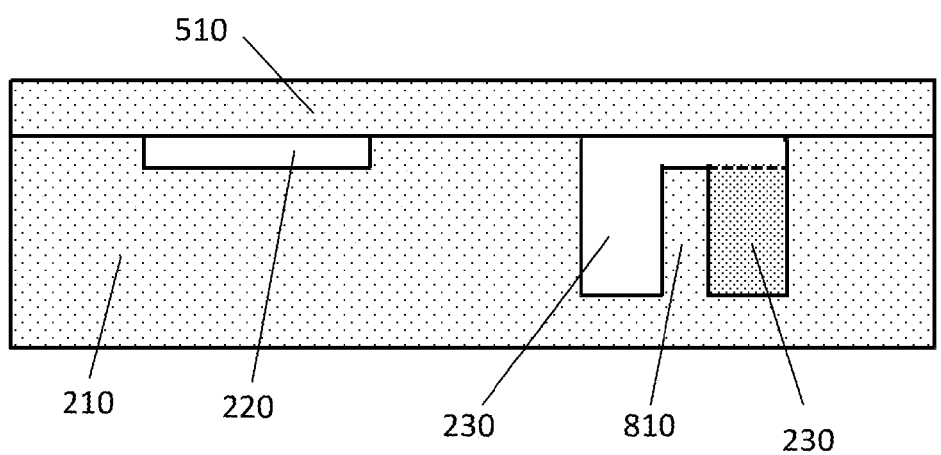
FIG. 10 illustrates a schematic vertical cross-section of an etched wafer as in FIG. 9, provided with a top wafer, in a method step according to embodiments of the present invention.

The different method steps according to an exemplary embodiment of the present invention are illustrated in FIG. 7 to FIG. 11. FIG. 7 shows a, for instance, 525 µm thick base wafer and a masking deposition with two level patterning. An exemplary embodiment of the first sub-step of the etching step 110 is illustrated in FIG. 8. During this step deep cavities are etched by means of a bottom mask 310, leaving pillars 810 across the area which later will be covered by the second membrane 272. A top view of these pillars 810, in this embodiment forming walls, is also shown in FIG. 13. In a second sub-step of the etching step 110 the top mask 710 is transferred to the surface to etch the shallow cavity. This is illustrated in FIG. 9. Using the top mask 710, free parts of the bottom mask 310 are removed, as well as thereafter accessible semiconductor material of the base wafer 210. During the second step 120 a top wafer (e.g. an oxide strip) 510 is applied, as illustrated in FIG. 10.

In some embodiments, both membrane openings are first made in an oxide mask, one of these openings is consequently covered with resist and RIE etching is then performed with hardly any etching of the resist. After the first etch forming at least part of the first opening, the resist can be stripped and then both openings are etched together.

Figure 5:
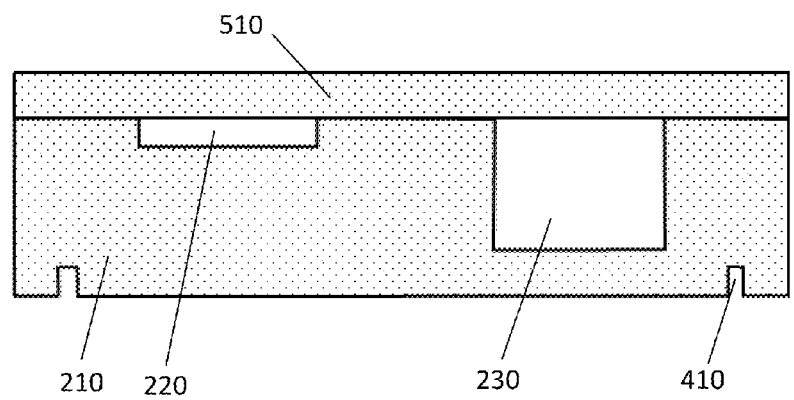
FIG. 5 illustrates a schematic vertical cross-section of an etched base wafer and top wafer in a method step according to embodiments of the present invention.
Figure 6:
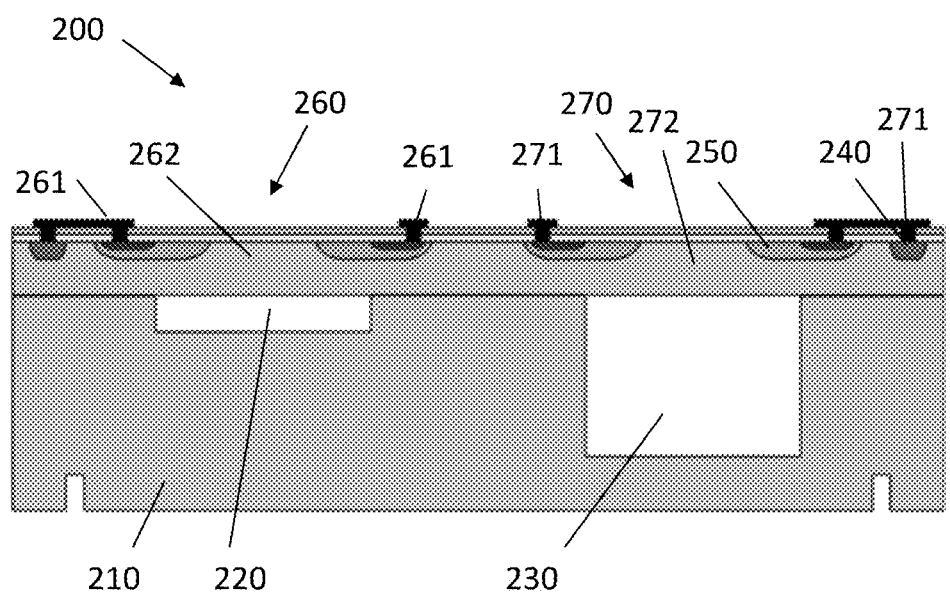
FIG. 6 illustrates a schematic vertical cross-section of two pressure sensors in a method step according to embodiments of the present invention, before back grinding of the etched base wafer.
Figure 11:
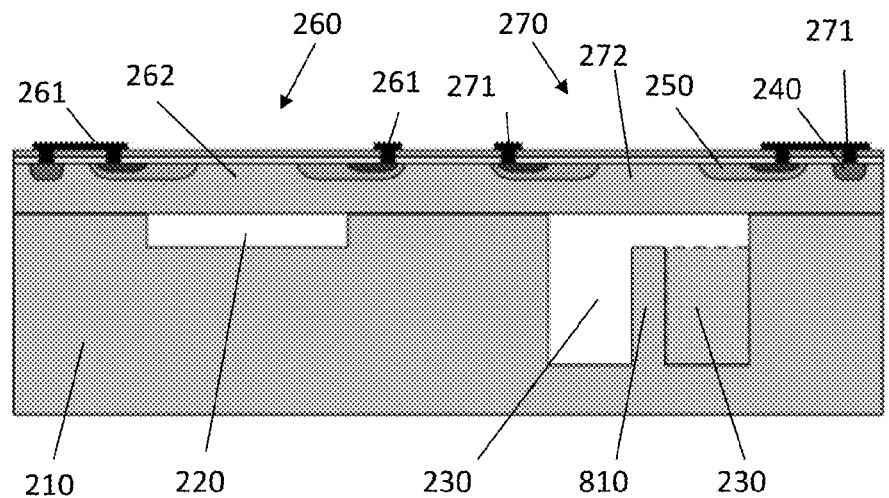
FIG. 11 illustrates a schematic vertical cross-section of two partially finished pressure sensors before back grinding according to embodiments of the present invention.

An example thereof is illustrated in FIGS. 5 and 6 or similarly in FIG. 10 and FIG. 11. In FIG. 5 the top wafer, which can for instance be a silicon on insulator wafer, may be applied through fusion bonding, after which thinning of the top wafer may be applied to form the membranes 262, 272. The latter is encompassed in step 125 which further may encompass the formation of elements such as electrical contacts. FIG. 6 shows an exemplary result after applying processing steps for creating the electrical contacts of a piezoelectric sensor. It thereby is an advantage that CMOS compatible processing can be performed.

Figure 12:
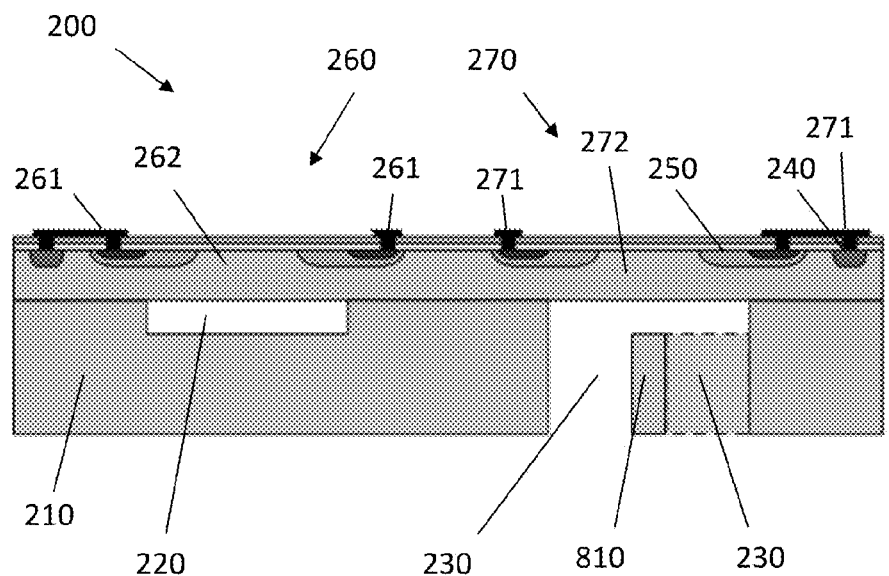
FIG. 12 shows a schematic vertical cross-section of a system comprising an absolute and a relative pressure sensor according to embodiments of the present invention.

FIG. 12 shows an exemplary result after applying the third step 130 (i.e. back grinding) on the wafer. In the exemplary embodiment of FIG. 12 the thickness of the base wafer is reduced from 525 µm to 400 µm by the back grinding. As can be seen on FIG. 12 this allowed to open the deep cavity 230 while the shallow cavity 220 still remained closed. The typical wafer thickness varies between 1 mm and 100 µm and backgrinding is performed for allowing opening of the deep cavity.

In embodiments of the present invention the system 200 comprises an absolute pressure sensor 260 (with closed cavity 220) and a relative pressure sensor 270 (with opened cavity 230) on a single chip.

In embodiments of the present invention the depth of the shallow cavity 220, for the absolute sensor 260, may be chosen in such a way that the bottom of the cavity supports the membrane 262 before the membrane 262 possibly bursts under outside pressure. Therefore it is an advantage of embodiments of the present invention that the pressure sensor according to embodiments of the present invention can withstand higher pressures than would be the case for an equivalent sensor without support for the membrane from the bottom of the cavity. The depth of the shallow cavity is therefore between 2 µm and 20 µm. The smaller the shallow cavity, the more sensitive it is for variations. In a second aspect, the present invention relates to a system 200 for measuring an absolute and a relative pressure. The system 200 comprises a base wafer 210 comprising a shallow cavity 220 and a deep cavity 230. The depth of the shallow cavity 220 is smaller than the depth of the deep cavity 230. The base wafer also may be referred to as bottom wafer.

The system 200 moreover comprises a top wafer 510 on top of the wafer 210. The top wafer 510 comprises elements forming a first sensor 260 and a second sensor 270. The first sensor 260 comprises a first membrane 262 over the shallow cavity 220 and first bondpads 261 for Piezo-resistivity measurements over the first membrane 262. The second sensor 270 comprises a second membrane 272 over the deep cavity 230 and second bondpads 271 for Piezo-resistivity measurements over the second membrane 272.

The back side of the base wafer 210 is removed such that the deep cavity 230 is opened but that the shallow cavity 220 is still closed by the backside of the base wafer 210. Therefore the system 200 can be used for measuring an absolute pressure with the first sensor 260 through the first bondpads 261 and a relative pressure with the second sensor 270 through the second bondpads 271.

FIG. 2 is a schematic drawing of an exemplary embodiment of the present invention. It shows the pressure measurement system 200 comprising a first sensor 260 formed by a closed shallow cavity 220, a membrane 262 above it and bondpads 261 for piezo-resistivity measurement over the first membrane 262. The pressure measurement system 200 furthermore comprises a second sensor 270 formed by a deep open cavity 230, a membrane 272 above it, and bondpads 271 for piezo-resistivity measurements over the second membrane 272.

In embodiments of the present invention the edges of the shallow cavity 220 and of the deep cavity 230 have an angle between 80° and 100°, such as for example 100°, with the vertical axis. The exemplary embodiment of FIG. 2 shows cavities with vertical walls. For the exemplary embodiment of FIG. 2 DRIE was used as etching method in the etching step 110.

In embodiments of the present invention the horizontal cross-section of the cavities is circular. An exemplary embodiment thereof is shown in FIG. 13. FIG. 13 shows the top view of a system 200. A shallow cavity 220 with circular cross section is shown.

In embodiments of the present invention the deep cavity 230 comprises at least one vertical pillar 810 wherein the top of the pillar reaches up to the same height as the bottom of the shallow cavity 220. An exemplary embodiment thereof is shown in FIG. 12 and in FIG. 13. FIG. 12 shows a vertical cross section of a system 200. In the deep cavity 230 a pillar 810 is shown. FIG. 13 also shows the deep cavity 230 and the pillars 810.

In embodiments of the present invention the area of the horizontal cross-section of the deep cavity 230 may have a different size than the area of the horizontal cross-section of the shallow cavity 220.

In embodiments of the present invention the first bondpads 261 and/or the second bondpads 271 are made of platinum or another metal suitable for wire bonding.

Figure 17:
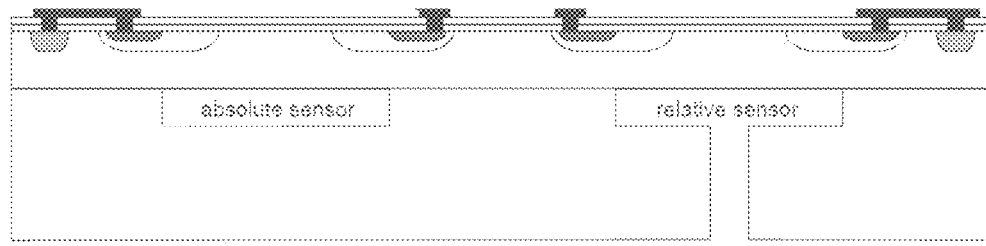
FIG. 17 illustrates a further embodiment of a pressure sensor according to an embodiment of the present invention, whereby the cavity for the relative sensor does not have a fixed width.

In still other embodiments, the open cavity forming the relative pressure sensor does not have a constant diameter. In some embodiments, the open cavity is formed of a more broad first subcavity lying deeper in the base substrate having a first diameter and a second subcavity, in connection with the first subcavity, which has a second diameter being smaller than the first diameter. An example thereof is shown in FIG. 17.

In this way it is also possible to create the opening to the back essentially outside the membrane area and to etch the channel between the hole and the membrane cavity during the membrane cavity etch.

Figure 14:
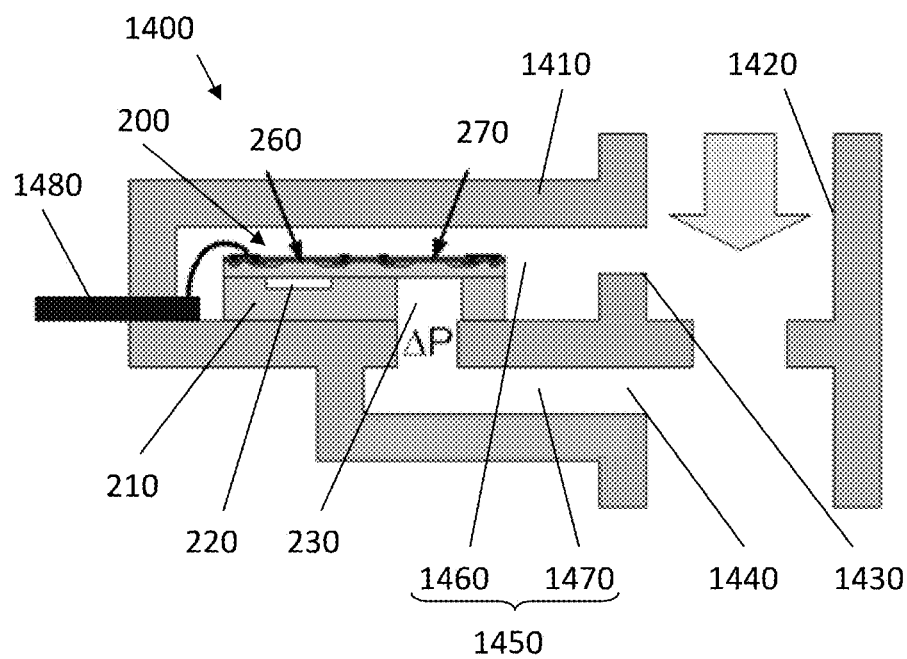
FIG. 14 is a schematic representation of a flow sensor with an absolute and a relative pressure sensor according to embodiments of the present invention.

In a third aspect, the present invention relates to a flow meter 1400 for measuring a gas flow. The flow meter 1400 comprises a housing 1410 for housing a pressure measurement system 200 according to embodiments of the present invention. The housing 1410 comprises a tube 1420 having an inlet and an outlet, wherein the tube has a first opening 1430 and a second opening 1440 along its length. The tube contains a venturi opening 1435 between the inlets 1430 and 1440 which causes a pressure difference between the two inlets when a flow is present in the tube. Both openings are oriented towards a cavity 1450 also comprised in the housing 1410. The pressure measurement system 200 according to embodiments of the present invention is positionable, and in the embodiment illustrated in FIG. 14 is positioned, in the cavity 1450. Positioning of the pressure measurement system 200 in the cavity 1450 separates the cavity 1450 in a first part 1460 communicating with the first opening and a second part 1470 communicating with the second opening. The positioning of the system 200 moreover is such that one side of the second membrane 272 of the relative pressure sensor 270 of the system 200 is in the first part 1460 of the cavity 1450, and that the open end of the deep cavity 230 of the relative pressure sensor is in the second part 1470 of the cavity 1450. The positioning of the system 200 moreover is such that the first membrane 262 of the absolute pressure sensor 260 is in the first part 1460 of the cavity 1450.

The pressure measurement system 200 according to embodiments of the present invention is thus mounted in the flow meter 1400 according to embodiments of the present invention such that a differential pressure can be measured between the first opening 1430 of the tube 1420 and the second opening 1440 thereof, by the relative pressure sensor 270 of the pressure measurement system 200. Moreover the absolute pressure at the first opening 1430 of the tube 1420 can be measured by the absolute pressure sensor 260 of the pressure measurement system 200. A connector 1480, connected with the first bondpads 261, may extend outside the housing 1410 thereby enabling measurements from outside the housing 1410. In embodiments of the present invention the housing 1410 may be made of plastic. It is convenient to place the read-out electronics in the housing also. Such read-out electronics can be provided by a CMOS circuit. The measurement principle on which the flow meter is based is the Bernouilli principle. It is an advantage of embodiments of the present invention that an absolute and relative pressure sensor integrated on one die can be applied for building a flow meter according to the Bernouilly principle. According to embodiments of the present invention, the circuitry for the piezo resistors can be a full blown CMOS process where the interface electronics are co-integrated with the piezo resistors.

A chip according to embodiments of the present invention with an absolute and a relative sensor with different sensitivity is advantageous. For instance, flow meters exist where the absolute pressure sensor has a range of about 1 bar and the relative pressure sensor has a range of 0.5 bar. The present invention allows to have absolute and relative pressure sensors on a single chip, each optimized for their sensitivity range.

FIG. 15 shows the output of an orifice flow sensor in function of the air flow. The individual graphs are each for a different absolute pressure:

graph 1610 corresponds with an absolute pressure of 800 mBar, graph 1620 corresponds with an absolute pressure of 975 mBar, graph 1630 corresponds with an absolute pressure of 1150 mBar, graph 1640 corresponds with an absolute pressure of 1500 mBar.

The graphs of FIG. 15 therefore illustrate the importance of measuring the absolute pressure for flow measurements.

The invention claimed is:

1. A method for manufacturing a pressure measurement system in a wafer for measuring an absolute pressure and a relative pressure, the method comprising:
    a first step wherein a shallow cavity and a deep cavity are etched in a base wafer, such that the depth of the shallow cavity is smaller than the depth of the deep cavity;
    a second step wherein a top wafer is applied to the base wafer;
    a third step wherein the top wafer is thinned for forming a first membrane over the shallow cavity and for forming a second membrane over the deep cavity, and wherein elements are formed in the top wafer, the elements allowing performing pressure measurements resulting in a first sensor and a second sensor, respectively; and
    a fourth step wherein back thinning is applied on the base wafer such that the deep cavity is opened from the backside of the base wafer and that the shallow cavity is still closed by the backside of the base wafer;
    wherein the system can be used for measuring the absolute pressure using the first sensor and the relative pressure using the second sensor, and wherein the etching of the first step defines the edges of the first membrane and of the second membrane in respectively the sensors formed from the shallow cavity and the deep cavity.

2. A method according to claim 1, wherein the etching in the first step is deep reactive-ion etching.

3. A method according to claim 1, wherein the etching in the first step comprises etching such that the horizontal cross-section of the cavities is circular.

4. A method according to claim 1, wherein the first step comprises two substeps:
    in a first substep the deep cavity is etched leaving at least one pillar inside the cavity, the pillar subdividing the cavity, and
    in a second substep the shallow cavity and a part of the at least one pillar are etched, wherein both are etched to the same depth.

5. A method according to claim 1, wherein the etching in the first step comprises etching such that the area of the horizontal cross-section of the deep cavity has a different size than the area of the horizontal cross-section of the shallow cavity.

6. A method according to claim 1, wherein the formation of the elements allowing performing pressure measurements is performed on the stack of the base wafer and the top substrate, after they have been applied to each other.

7. A method according to claim 6, wherein the formation of the elements is performed by CMOS like processing.

8. A method according to claim 6, wherein the formation of the elements is performed by a CMOS process and where a CMOS sensor interface is realized around the sensor membranes.

9. A method according to claim 6, wherein applying the base wafer and the top wafer comprises bonding said base wafer and said top wafer in a vacuum environment.

10. A method according to claim 1, wherein the top wafer is an SOI wafer with a thin silicon bonded to the base wafer and where a buried oxide of the SOI wafer is used as an etch stop for the thinning process to obtain good thickness uniformity of the membranes.

* * * * *